United States Patent
Senda et al.

(10) Patent No.: US 7,206,993 B2
(45) Date of Patent: Apr. 17, 2007

(54) METHOD AND DEVICE FOR DECODING REED-SOLOMON CODE OR EXTENDED REED-SOLOMON CODE

(75) Inventors: Hiroyuki Senda, Kyoto (JP); Toshihiko Fukuoka, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 562 days.

(21) Appl. No.: 10/714,363

(22) Filed: Nov. 17, 2003

(65) Prior Publication Data
US 2004/0199857 A1 Oct. 7, 2004

(30) Foreign Application Priority Data
Mar. 12, 2003 (JP) .............................. 2003-066149

(51) Int. Cl.
*H03M 13/00* (2006.01)
(52) U.S. Cl. ................................................... 714/784
(58) Field of Classification Search ............... 714/784, 714/746, 785
See application file for complete search history.

(56) References Cited

U.S. PATENT DOCUMENTS

| | | | | |
|---|---|---|---|---|
| 5,373,511 A | * | 12/1994 | Veksler | 714/755 |
| 5,737,343 A | * | 4/1998 | Meyer | 714/784 |
| 5,905,740 A | * | 5/1999 | Williamson | 714/784 |
| 5,978,956 A | * | 11/1999 | Weng et al. | 714/784 |
| 6,081,920 A | | 6/2000 | Morelos-Zaragoza | |
| 6,122,766 A | * | 9/2000 | Fukuoka et al. | 714/784 |
| 6,131,178 A | | 10/2000 | Fujita et al. | |
| 6,145,112 A | | 11/2000 | Fujita et al. | |
| 6,487,691 B1 | * | 11/2002 | Katayama et al. | 714/784 |
| 6,658,605 B1 | * | 12/2003 | Yoshida et al. | 714/702 |
| 6,802,040 B1 | * | 10/2004 | Ohyama et al. | 714/781 |
| 7,020,826 B2 | * | 3/2006 | Litwin et al. | 714/784 |

FOREIGN PATENT DOCUMENTS

EP 1 280 281 A1 1/2003

* cited by examiner

*Primary Examiner*—Albert Decady
*Assistant Examiner*—Sam Rizk
(74) *Attorney, Agent, or Firm*—McDermott Will & Emery LLP (57) ABSTRACT

A decoding device compares the number of errors estimated from input data syndromes by an error number estimation section with the number of errors computed by an error number computation section during decoding process, performs error correction by an error correction section based on this comparison result and the input data syndromes, performs a syndrome computation for error corrected data by a syndrome computation section again to obtain corrected data syndromes, and outputs input data as second corrected data when erroneous correction is performed or the estimated number of errors differs from the computed number of errors.

13 Claims, 8 Drawing Sheets

METHOD AND DEVICE FOR DECODING REED-SOLOMON CODE OR EXTENDED REED-SOLOMON CODE

BACKGROUND OF THE INVENTION

The present invention relates to a decoding technology of performing multiple error correction for a Reed-Solomon code or an extended Reed-Solomon code.

Reed-Solomon codes have been used in digital broadcasting, digital magnetic recording and the like. In a digital cable television system in the United States, for example, an extended Reed-Solomon code is adopted.

According to a first conventional technique, when an extended Reed-Solomon code is decoded, input data that is a received word is subjected to an error correction processing, the error corrected data is subjected to a syndrome computation again to obtain corrected data syndromes, and when the input data is erroneously corrected, the input data before the error correction is output (see European Laid-Open Patent Publication No. 1280281).

According to a second conventional technique, when an extended Reed-Solomon code is decoded, syndromes are generated from a received word, the number of errors generated in the received word is estimated from these syndromes, an initial value and end conditions are for an Euclidean algorithm operation are changed and error correction is carried out according to the estimated number of errors (see U.S. Pat. No. 6,131,178).

However, according to the first conventional technique, not only an extended component but also an unextended component is erroneously corrected in some cases.

According to the second conventional technique, if the number of errors is erroneously estimated, it is necessary to perform the Euclidean algorithm operation and a Chien search twice or more. This disadvantageously causes another erroneous correction in some cases.

SUMMARY OF THE INVENTION

An object of the present invention is to prevent erroneous correction generated when a Reed-Solomon code or an extended Reed-Solomon code is decoded.

In order to achieve the above object, the present invention provides a method for decoding a received word made of one of a Reed-Solomon code and an extended Reed-Solomon code having a certain number of error corrections as input data, the decoding method comprising: performing error correction for the input data using an error locator polynomial and an error evaluator polynomial derived based on the input data and syndromes of the number of error corrections to set the result of error correction as first corrected data; computing an extended component and an unextended component of syndromes of the first corrected data; and performing the error correction for the first corrected data based on the computed syndromes to set the result of error correction as second corrected data.

The decoding method further comprises: estimating the number of errors generated in the input data based on the syndromes of the input data; computing the number of errors using the error locator polynomial and the error evaluator polynomial derived based on the syndromes of the input data and the number of error corrections; and obtaining the first corrected data using the estimated number of errors and the computed number of errors.

According to the present invention, the number of errors estimated from the input data syndromes is compared with the number of errors computed during decoding process, and the error correction is performed based on this comparison result and the input data syndromes. Thereafter, the error corrected data is subjected to a syndrome computation again to obtain corrected data syndromes. When erroneous correction is performed, or the estimated number of errors differs from the computed number of errors, the input data is output as final corrected data. Therefore, it is possible to prevent erroneous correction from being performed for the extended component and the other components, and dispense with performing plural times of Euclidean algorithm operations and plural times Chien search processings. It is thereby possible to provide a decoding device architecture small in area, low in power and high in reliability. Further, it is possible to prevent erroneous correction from being performed for not only an extended Reed-Solomon code but also an ordinary Reed-Solomon code.

DETAILED DESCRIPTION OF THE INVENTION

An embodiment of the present invention will be described hereinafter in detail with reference to the accompanying drawings.

An extended Reed-Solomon code to be handled herein is a singly extended Reed-Solomon code in a Galois field $GF(2^7)$ in which a code length n=128, the number of error corrections t=3, the number of bits per symbol m=7, the number of information symbols $i_0$=122, the number of parity symbols $p_0$=6, a code polynomial before extension $W_0(x) = c_{126}x^{126} + c_{125}x^{125} + \ldots + c_1 x + c_0$, and an extended parity symbol $c_- = W_0(\alpha^6) = c_{126}(\alpha^6)^{126} + c_{125}(\alpha^6)^{125} + \ldots + c_1\alpha^6 + c_0$, a code polynomial after extension $W(x) = xW_0(x) + c_- = c_{126}x^{127} + c_{125}x^{126} + \ldots + c_1 x^2 + c_0 x + c_-$, and a primitive polynomial $P(x) = x^7 + x^3 + 1$ and a generation polynomial $G(x) = (x+\alpha)(x+\alpha^2)(x+\alpha^3)(x+\alpha^4)(x+\alpha^5)$ are used. The code before extension, i.e., the code which is not an extended component ($c_{126}, c_{125}, \ldots, c_1, c_0$) will be referred to as an unextended component, hereinafter. In addition, the extended parity symbol $c_-$ will be referred to as an extended component hereinafter.

Figure 1:
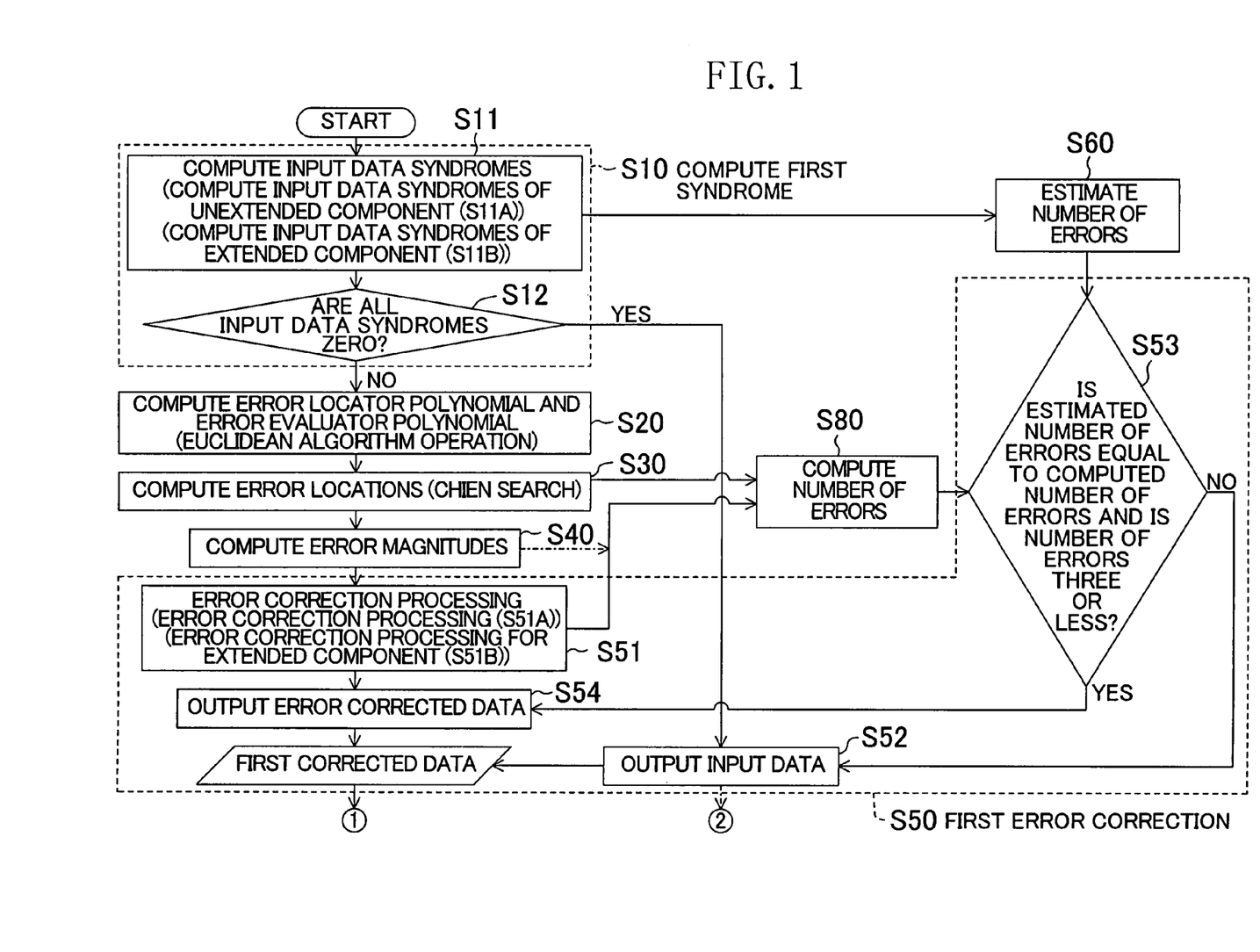
FIG. 1 is a flowchart for describing one example of procedures of a method for decoding an extended Reed-Solomon code according to the present invention.
Figure 2:
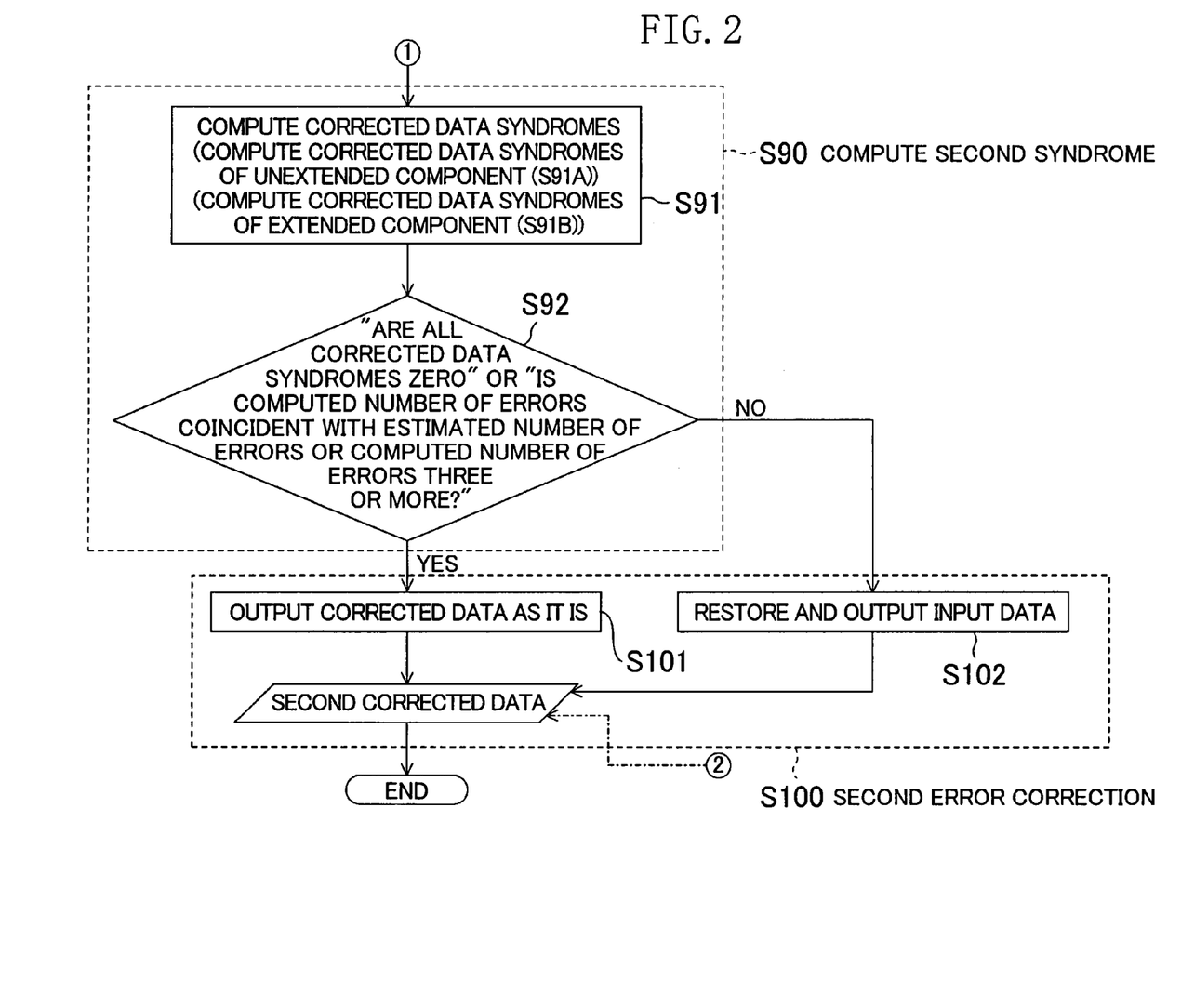
FIG. 2 is a flowchart following the flowchart of FIG. 1.

FIGS. 1 and 2 are flowchart for describing a method for decoding an extended Reed-Solomon code according to the present invention. It is assumed herein that input data DI, which is a received word, has an error having a magnitude of $e_u$ in a symbol at a location $j_u$ of input data DI. It should be noted that the following polynomials are used.

Reception polynomial of only the unextended component $Y_0(x)=y_{126}x+y_{125}x^{125}+\ldots+y_1x+y_0$, and Reception polynomial of the unextended component and the extended component $Y(x)=y_{126}x^{127}+y_{125}x^{126}+\ldots+y_1x^2+y_0x+y_-$.

The location $j_u$ of the error symbol in the input data DI will be referred to as an error location, hereinafter.

In FIG. 1, step S10 is a first syndrome computation step. In this step S10, the following steps S11 and S12 are executed to compute syndromes.

In step S11, syndromes of the input data $DI=(y_{126}, y_{125}, \ldots, y_1, y_0, y_-)$ are computed as input data syndromes SI. Specifically, in step S11A, input data syndromes of an unextended component are computed as follows.

$SI_i=Y_0(\alpha^i)=y_{126}(\alpha^i)^{126}+y_{125}(\alpha^i)^{125}+\ldots+y_1\alpha^i+y_0$,
where $i=1,2,3,4,$ and $5$.

In step S11B, input data syndromes of an extended component are computed as follows.

$SI_6=Y_0(\alpha^6)+y_-=y_{126}(\alpha^6)^{126}+y_{125}(\alpha^6)^{125}+\ldots+y_1\alpha^6+y_0+y_-$.

In step S12, it is determined whether all the input data syndromes SI are zero. When all the input data syndromes SI are zero, it is determined that the input data DI has no error, and the process proceeds to step S52 in step S50. When one of the input data syndromes SI is not zero, it is determined that the input data DI has an error and the process proceeds to step S20.

In step S20, coefficients at each order of an error locator polynomial $\sigma(z)$ and an error evaluator polynomial $\omega(z)$ are computed from the input data syndromes SI by a Euclidean algorithm operation. The coefficients of these polynomials are output even when the order of the error locator polynomial $\sigma(z)$ is equal to or less than the order of the error evaluator polynomial $\omega(z)$ at the completion of the Euclidean algorithm operation.

In step S30, a Chien search is performed to determine roots $\alpha^{-ju}$ of the error locator polynomial $\sigma(z)$. Specifically, elements of the Galois field $GF(2^7)$ are sequentially substituted in the error locator polynomial $\sigma(z)$ to determine the elements of which substitution makes the value of the error locator polynomial $\sigma(z)$ zero as the roots $\alpha^{-ju}$ of the error locator polynomial $\sigma(z)$. At this time, even when the number of different roots of the error locator polynomial $\sigma(z)$ in the Galois field $GF(2^7)$ is less than the order of the error locator polynomial $\sigma(z)$, it is not determined whether error correction is possible, and the roots $\alpha^{-ju}$ are output. The error locations $j_u$ correspond to the respective roots $\alpha^{-ju}$ of the error locator polynomial $\sigma(z)$. Further, the respective roots $\alpha^{-ju}$ of the error locator polynomial $\sigma(z)$ are substituted in the error evaluator polynomial $\omega(z)$ to obtain respective error evaluation values $\omega(\alpha^{-ju})$. In addition, the respective roots $\alpha^{-ju}$ of the error locator polynomial $\sigma(z)$ are substituted in a derivative of the error locator polynomial $\sigma(z)$ to obtain error locator polynomial differential values $\sigma'(\alpha^{-ju})$.

In step S40, each of the error evaluation values $\omega(\alpha^{-ju})$ is divided by the corresponding error locator polynomial differential value $\sigma'(\alpha^{-ju})$ to obtain an error magnitude $e_u$ that indicates an error bit in the symbol at the error location $j_u$.

In step S50, a first correction is performed. Specifically, the following steps S51, S52, S53 and S54 are executed.

In step S51, step S51A is executed to the unextended component and the extended component and step S51B is executed to the extended component, to perform error correction.

In step S51A, based on the error locations $j_u$ corresponding to the respective roots $\alpha^{-ju}$ of the error locator polynomial $\sigma(z)$ and the error magnitudes $e_u$, the input data DI is subjected to an error correction processing to obtain error corrected data. In addition, the following polynomials are obtained.

Polynomial of error corrected data including only the unextended component $F_0(x)=f_{126}x^{126}+f_{125}x^{125}+\ldots+f_1x+f_0$.

Polynomial of error corrected data including the unextended component and the extended component $F(x)=xF_0(x)+f_-=f_{126}x^{127}+f_{125}x^{126}+\ldots+f_1x^2+f_0x+f_-$, where $f_-$ is the extended component (tentative value).

Specifically, the corresponding error magnitude $e_u$ is subtracted from the symbol at the error location $j_u$ of the input data DI. Since this is an operation in the extension field of the Galois field $GF(2)$, addition of the error magnitude $e_u$ to the symbol is allowed in place of the subtraction.

In step S51B, $x=\alpha^6$ is substituted in the polynomial $F_0(x)$ of the error corrected data including only the unextended component, and the extended component $f_-$ (tentative value) of the error corrected data is further added to the substitution result in the extended component. That is, the following computation is performed.

$F_0(\alpha^6)+f_-=f_{126}(\alpha^6)^{126}+f_{125}(\alpha^6)^{125}+\ldots+f_1\alpha^6+f_0+f_-$.

When $F_0(\alpha^6)+f_-$ is zero, it is determined that the extended component $f_-$ (tentative value) of the error corrected data has no error. Therefore, the extended component $f_-$ (tentative value) of the error corrected data is set as the error corrected data on the extended component as it is and it is determined that the number of errors in the extended component is $NB=0$. When $F_0(\alpha^6)+f_-$ is not zero, it is determined that the extended component $f_-$ (tentative value) of the error corrected data has an error and the error magnitude $e_-$ of the extended component $f_-$ (tentative value) of the error corrected data is computed as $F_0(\alpha^6)+f_-$. Thereafter, the extended component $f_-$ (tentative value) of the error corrected data is subjected to an error correction processing, i.e., the error magnitude $e_-=F_0(\alpha^6)+f_-$ is added to the extended component $f_-$ (tentative value) of the error corrected data as follows.

$f_-+e_-=f_-+F_0(\alpha^6)+f_-=F_0(\alpha^6)+2f_-=F_0(\alpha^6)$.

The addition result is set as the error corrected data including the extended component and the number of errors in the extended component NB is set at one $(NB=1)$.

In step S60, the number of errors EN1 that have been generated in the input data DI is estimated from the input data syndromes SI computed in step S11 in step S10 (the estimation will be described later in detail).

In step S80, the number of errors NA obtained from the roots $\alpha^{-ju}$ of the error locator polynomial $\sigma(z)$ computed in step S30 and the number of errors NB in the extended component that is computed in step S51B in step S51 are added together. Namely, the number of errors $EN2=NA+NB$ is computed. It is noted, however, that the number of errors in the extended component is not repeatedly added.

In step S53 in step S50, it is determined whether the number of errors EN1 estimated in step S60 is equal to the number of errors EN2 computed in step S80 and whether the number of errors EN1 estimated in step S60 and the number of errors EN2 computed in step S80 are both equal to or less than three (the number of corrections t), i.e., whether EN1 and EN2 satisfy a relationship of "$EN1=EN2\leq3$". When "EN1=EN2≦3" is satisfied, the process proceeds to step S54. When not ("EN1≠EN2, EN1>3 or EN2>3"), the process proceeds to step S52.

In step S54, which is executed when one of the input data syndromes SI is not zero and the EN1 and the EN2 satisfy "EN1=EN2≦3", the error corrected data is set as first corrected data C1.

In step S52, which is executed all the input data syndromes SI are zero or the EN1 and the EN2 satisfy "EN1≠EN2, EN1>3 or EN2>3", the input data DI is set as the first corrected data C1 as it is.

In step S90 shown in FIG. 2, the following steps S91 and S92 are executed to compute syndromes of the first corrected data C1.

In step S91, using the following polynomials:

Polynomial of the first corrected data C1 including only the unextended component $D_0(x)=d_{126}x^{126}+d_{125}x^{125}+\ldots+d_1x+d_0$; and Polynomial of the first corrected data C1 including the unextended component and the extended component $D(x)=d_{126}x^{127}+d_{125}x^{126}+\ldots+d_1x^2+d_0x+d_-$, syndromes of the first corrected data $C1=(d_{126}, d_{125}, \ldots, d_1, d_0, d_-)$ are computed as corrected data syndromes SC. Specifically, in step S91A, the corrected data syndromes of the unextended component are computed as follows.

$$SC_i=D_0(\alpha^i)=d_{126}(\alpha^i)^{126}+d_{125}(\alpha^i)^{125}+\ldots+d_1\alpha^i+d_0,$$
where $i=1,2,3,4$ and 5.

In step S91B, the corrected data syndromes of the extended component are computed as follows.

$$SC_6=D_0(\alpha^6)+d_-=d_{126}(\alpha^6)^{126}+d_{125}(\alpha^6)^{125}+\ldots+d_1\alpha^6+d_0+d_-$$

In step S92, it is determined whether the determination condition of "ARE ALL CORRECTED DATA SYNDROMES ZERO OR 'EN1≠EN2, EN1>3, OR EN2>3'?" is true. When the determination condition is true, it is determined that the first corrected data C1 has no error and the process proceeds to step S101 in step S100. When the determination condition is not true (one of the corrected data syndromes SC is not zero and 'EN1=EN2≦3'), it is determined that the first corrected data C1 has an error and the process proceeds to step S102 in step S100.

Step S100 is a second error correction step. Specifically, steps S101 and S102 are executed.

In step S101, since it is determined that the first corrected data C1 has no error, the first corrected data C1 is output as second corrected data C2 as it is.

In step S102, since it is determined that the first corrected data C1 has an error, the first corrected data C1 is restored to the input data DI based on the error locations $j_u$ and error magnitudes $e_u$ corresponding to the respective roots $\alpha^{-ju}$ of the error locator polynomial $\sigma(z)$ and the error magnitude $e_-$ of the extended component. Specifically, the corresponding error magnitude $e_u$ is added to or subtracted from the symbol at the error location $j_u$ of the first corrected data C1, and the error magnitude $e_-$ is further added to or subtracted from the symbol of the extended component in the first corrected data C1 (that is, the error magnitude $e_u$ and error magnitude $e_-$ are added to or subtracted from the symbol of the extended component of the first corrected data C1). The restored input data DI thus obtained is output as the second corrected data C2.

Figure 3:
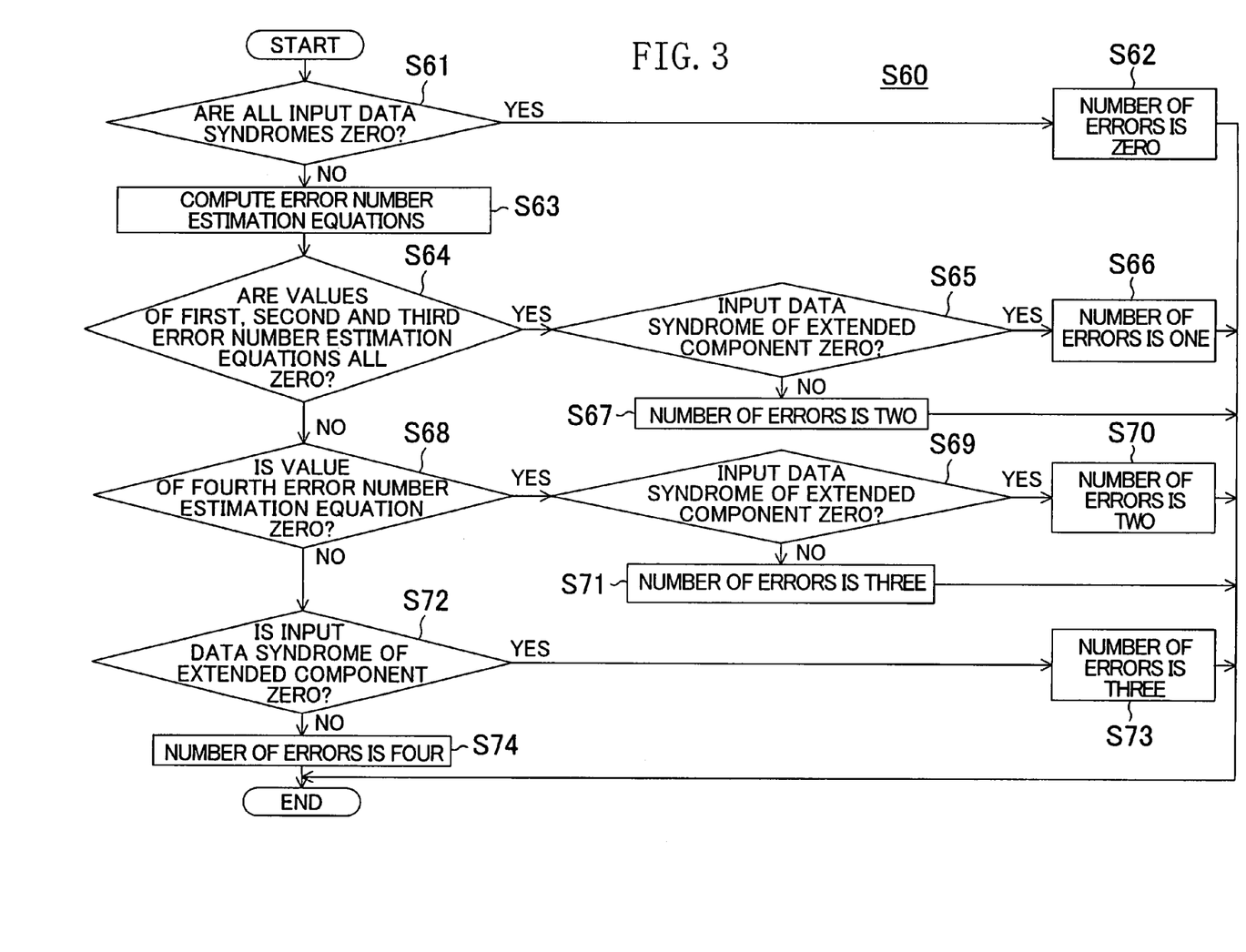
FIG. 3 is a detailed flowchart of an error number estimation step shown in FIG. 1.

FIG. 3 is a detailed flowchart for an error number estimation step S60 shown in FIG. 1. Hereinafter, a method for estimating the number of errors will be described with reference to FIG. 3.

In step S61, it is determined whether all the input data syndromes SI computed in the input data syndrome computation step S11 in the first syndrome computation step S10 are zero. When all the input data syndromes SI are zero, the process proceeds to step S62. When one of the input data syndromes SI is not zero, the process proceeds to step S63.

In step S62, which is executed when it is determined that all the input data syndromes SI are zero, it is estimated that the number of errors is zero.

In step S63, which is executed when it is determined that one of the input data syndromes SI is not zero, the following first to fourth error number estimation equations are computed.

First error number estimation equation $N_1=S_2^2+S_1S_3$
Second error number estimation equation $N_2=S_3^2+S_1S_5$
Third error number estimation equation $N_3=S_4^2+S_3S_5$
Fourth error number estimation equation $N_4=S_5N_1+S_3N_2+S_1N_3$ In step S64, it is determined whether all the values computed from the first, second and third error number estimation equations ($N_1$, $N_2$ and $N_3$) are zero. When all the values of $N_1$, $N_2$ and $N_3$ are zero, the process proceeds to step S65. When one of the values of $N_1$, $N_2$ and $N_3$ is not zero, the process proceeds to step S68.

In step S65, which is executed when it is determined that all the values of $N_1$, $N_2$ and $N_3$ are zero in step S64, it is determined whether an extended component $SI_6$ of the input data syndromes SI computed in step S11 is zero. When $SI_6$ is zero, the process proceeds to step S66. When $SI_6$ is not zero, the process proceeds to step S67.

In step S66, which is executed when it is determined that $SI_6$ is zero in step S65, it is estimated that the number of errors is one.

In step S67, which is executed when it is determined that $SI_6$ is not zero in step S65, it is estimated that the number of errors is two.

In step S68, which is executed when it is determined that one the values of $N_1$, $N_2$ and $N_3$ is not zero in step S64, it is determined whether the fourth error number estimation equation $N_4$ is zero. When $N_4$ is zero, the process proceeds to step S69. When $N_4$ is not zero, the process proceeds to step S72.

In step S69, which is executed when it is determined that the value of $N_4$ is zero in step S68, it is determined whether the extended component $SI_6$ of the input data syndromes SI is zero. When $SI_6$ is zero, the process proceeds to step S70. When $SI_6$ is not zero, the process proceeds to step S71.

In step S70, which is executed when it is determined that $SI_6$ is zero in step S69, it is estimated that the number of errors is two.

In step S71, which is executed when it is determined that $SI_6$ is not zero in step S69, it is estimated that the number of errors is three.

In step S72, which is executed when it is determined that the value of $N_4$ is not zero in step S68, it is determined whether $SI_6$ is zero. When $SI_6$ is zero, the process proceeds to step S73. When $SI_6$ is not zero, the process proceeds to step S74.

In step S73, which is executed when it is determined that $SI_6$ is zero in step S72, it is estimated that the number of errors is three.

In step S74, which is executed when it is determined that $SI_6$ is not zero in step S72, it is estimated that the number of errors is four.

As described above, in the decoding method of the present invention, the number of errors EN1 estimated from the input data syndromes SI is compared with the number of errors EN2 computed in the decoding process. After the error correction processing is performed based on this comparison result and the input data syndromes SI, syndromes of the error corrected data C1 are computed again to obtain the corrected data syndromes SC. When the input data DI is erroneously corrected or the estimated number of errors EN1 differs from the computed number of errors EN2, the input data DI is output as the second corrected data C2. Therefore, it is possible to prevent erroneous correction from being performed for the unextended component and the extended component and dispense with performing plural times of Euclidean algorithm operations and plural times of Chien searches.

In FIG. 1, the number of errors NB in the extended component is obtained in step S51B. Alternatively, as indicated by a one-dot chain line in FIG. 1, $F_0(\alpha^6)+f_-$ may be computed based on the input data DI and the error locations $j_u$ and the error magnitudes $e_u$ corresponding to the respective roots $\alpha^{-ju}$ of the error locator polynomial $\sigma(z)$ in step S40, the number of errors NB in the extended component may be obtained according to whether $F_0(\alpha^6)+f_-$ is zero, and the result may be reflected in the process executed in step S80.

Further, as indicated by a one-dot chain line extended from step S52 shown in FIG. 1 into step S100 shown in FIG. 2, when all the input data syndromes SI are zero or "EN1≠EN2, EN1>3 or EN2>3", the input data DI may be output as the second corrected data C2 as it is.

In step S80 shown in FIG. 1, the number of errors NA is obtained based on the roots $\alpha^{-ju}$. Alternatively, the number of errors NA may be obtained in step S30. In addition, steps S62 and S63 shown in FIG. 3 can be executed, in place of step S61 shown in FIG. 3, using the determination result of step S12 shown in FIG. 1.

Furthermore, by omitting the processings of steps S60, S80 and S53 shown in FIG. 1, only the corrected data syndromes SC may be computed and the computation result may be used for preventing erroneous correction without estimating and computing the number of errors.

The configuration of a device that realizes the decoding method according to the present invention will next be described.

Figure 4:
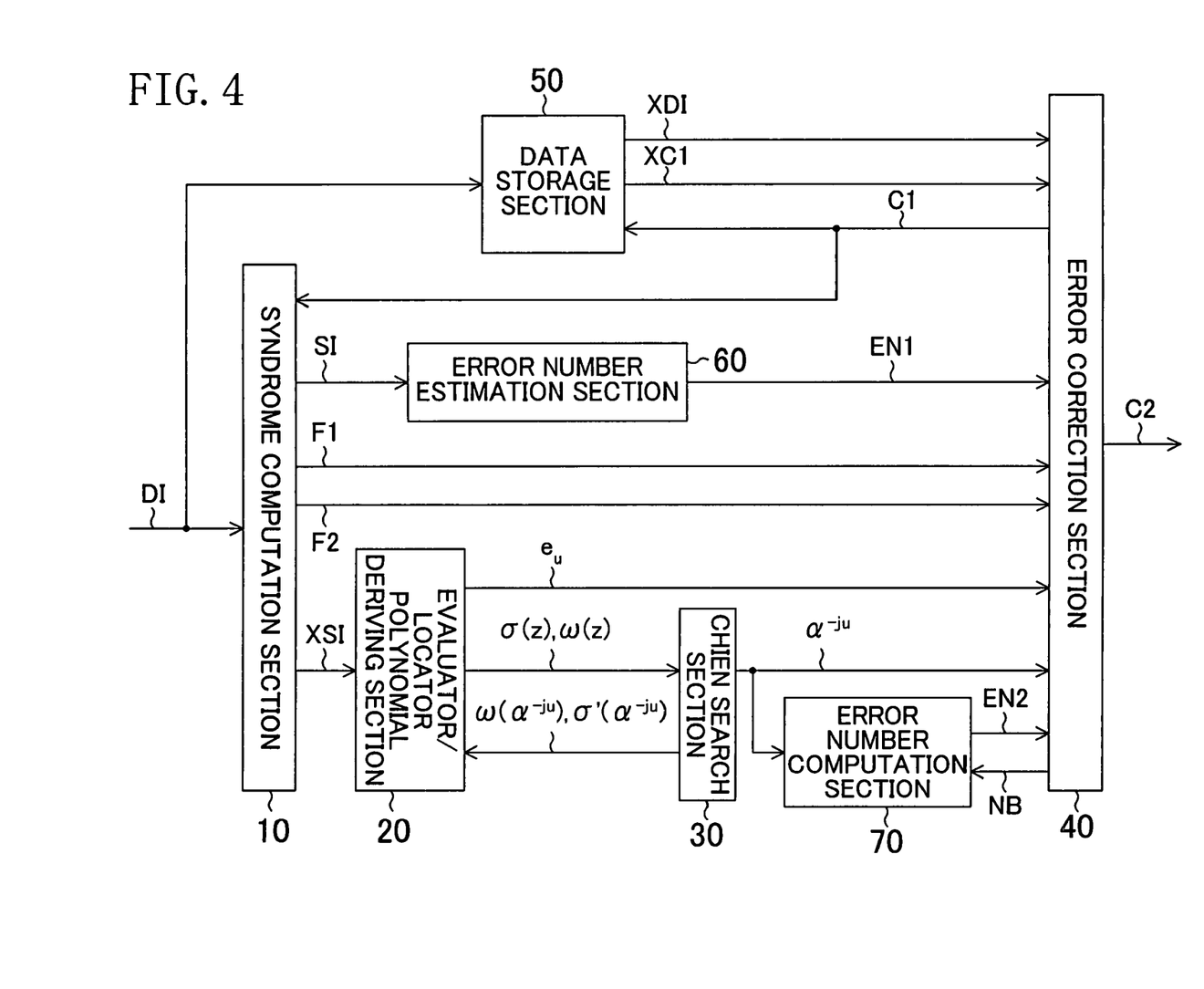
FIG. 4 is a block diagram illustrating one example of the configuration of an extended Reed-Solomon code decoding device according to the present invention.

FIG. 4 is a block diagram illustrating an extended Reed-Solomon decoding device according to the present invention. In FIG. 4, reference symbol 10 denotes a syndrome computation section, 20 denotes an evaluator/locator polynomial deriving section, 30 denotes a Chien search section, 40 denotes an error correction section, 50 denotes a data storage section, 60 denotes an error number estimation section, and 70 denotes an error number computation section.

The input data DI is input to the syndrome computation section 10 and the data storage section 50. The data storage section 50 stores the input data DI and then outputs data XDI that is the same as the input data DI to the error correction section 40.

The syndrome computation section 10 computes syndromes of the input data $DI=(y_{126}, y_{125}, \ldots, y_1, y_0, y_-)$ as input data syndromes SI. Specifically, the syndrome computation section 10 computes input data syndromes of an unextended component as follows.

$$SI_i = Y_0(\alpha^i) = y_{126}(\alpha^i)^{126} + y_{125}(\alpha^i)^{125} + \ldots + y_1\alpha^i + y_0,$$
where $i=1,2,3,4$ and $5$.

In addition, the syndrome computation section 10 computes input data syndromes of an extended component as follows.

$$SI_6 = Y_0(\alpha^6) + y_- = y_{126}(\alpha^6)^{126} + y_{125}(\alpha^6)^{125} + \ldots + y_1\alpha^6 + y_0 + y_-.$$

Further, the syndrome computation section 10 detects whether all the input data syndromes SI are zero. When all the input data syndromes SI are zero, the syndrome computation section 10 determines that the input data DI has no error, and asserts a first flag signal F1, and outputs the first flag signal F1 to the error correction section 40. When one of the input data syndromes SI is not zero, the syndrome computation section 10 determines that the input data DI has an error, negates the first flag signal F1, and outputs the first flag signal F1 to the error correction section 40. In either case, the syndrome computation section 10 outputs the input data syndromes SI to the evaluator/locator polynomial deriving section 20 and the error number estimation section 60. It is noted that the input data syndromes output to the evaluator/locator polynomial deriving section 20 and those output to the error number estimation section 60 are differently denoted by XSI and SI, respectively.

The error number estimation section 60 estimates the number of errors EN1 generated in the input data DI from the input data syndromes SI computed by the syndrome computation section 10.

The evaluator/locator polynomial deriving section 20 computes coefficients at each order of the error locator polynomial $\sigma(z)$ and the error evaluator polynomial $\omega(z)$ from the input data syndromes XSI by Euclidean algorithm operation and outputs the resultant coefficients of the polynomials to the Chien search section 30. The evaluator/locator polynomial deriving section 20 includes a data holder and a Galois operator. The data holder holds the input data syndromes XSI and intermediate results of Euclidean algorithm operation, and finally outputs the coefficients at each order of the error locator polynomial $\sigma(z)$ and the error evaluator polynomial $\omega(z)$. The Galois operator executes Euclidean algorithm operation for the output of the data holder to obtain the intermediate results, and outputs the obtained intermediate results to the data holder. It is noted that the evaluator/locator polynomial deriving section 20 outputs the coefficients of these polynomials even when the order of the error locator polynomial $\sigma(z)$ is equal to or less than the order of the error evaluator polynomial $\omega(z)$ at the completion of the Euclidean algorithm operation.

The Chien search section 30 performs a Chien search to determine roots $\alpha^{-ju}$ of the error locator polynomial $\sigma(z)$. Specifically, the Chien search section 30 sequentially substitutes elements of the Galois field GF($2^7$) in the error locator polynomial $\sigma(z)$, determines the elements of which substitution makes the value of the error locator polynomial $\sigma(z)$ zero as the roots $\alpha^{-ju}$ of the error locator polynomial $\alpha(z)$, and outputs the roots to the error correction section 40 and the error number computation section 70. At this time, even when the number of different roots of the error locator polynomial $\sigma(z)$ in the Galois field GF($2^7$) is less than the order of the error locator polynomial $\sigma(z)$, the Chien search section 30 does not make decision on whether error correction is possible, and outputs the roots $\alpha^{-ju}$ to the error correction section 40 and the error number computation section 70. The error locations $j_u$ correspond to the respective roots $\alpha^{-ju}$ of the error locator polynomial $\sigma(z)$. Further, the Chien search section 30 substitutes the respective roots $\alpha^{-ju}$ of the error locator polynomial $\sigma(z)$ in the error evaluator polynomial $\omega(z)$ to obtain respective error evaluation values $\omega(\alpha^{-ju})$, and also substitutes the respective roots $\alpha^{-ju}$ of the error locator polynomial $\sigma(z)$ in the derivative of the error locator polynomial $\sigma(z)$ to obtain error locator polynomial differential values $\sigma'(\alpha^{-ju})$. The Chien search section 30 outputs the error evaluation values $\omega(\alpha^{-ju})$ and the error locator polynomial differential values $\sigma'(\alpha^{-ju})$ to the evaluator/locator deriving section 20. The Galois operator of the evaluator/locator polynomial deriving section 20 divides each of the error evaluation values $\omega(\alpha^{-ju})$ by the corresponding error locator polynomial differential value $\sigma'(\alpha^{-ju})$ to obtain an error magnitude $e_u$ that indicates an error bit in the symbol at the error location $j_u$, and outputs the obtained error magnitude $e_u$ to the error correction section 40.

The error number computation section 70 adds up the number of errors NA obtained from the roots $\alpha^{-ju}$ of the error locator polynomial $\sigma(z)$ computed by the Chien search section 30 and the number of errors NB in the extended component output from the error correction section 40. Specifically, the error number computation section 70 computes:

Number of errors $EN2=NA+NB$.

The error number computation section 70 supplies the computed number of errors EN2 to the error correction section 40. It is noted that the number of errors in the extended component is not repeatedly added to the number of errors NA.

The error correction section 40 performs error correction for the input data XDI output from the data storage section 50 based on the error locations $j_u$ corresponding to the respective roots $\alpha^{-ju}$ of the error locator polynomial $\sigma(z)$ output from the Chien search section 30 and the error magnitudes $e_u$ output from the evaluator/locator polynomial deriving section 20 to obtain error corrected data. In addition, the error correction section 40 obtains the following polynomials.

Polynomial of error corrected data including only the unextended component $F_0(x)=\mu f_{126}x^{126}+f_{125}x^{125}+\ldots+f_1x^1+f_0$.

Polynomial of error corrected data including the unextended component and the extended component $F(x)=xF_0(x)+f_-=f_{126}x^{127}+f_{125}x^{126}+\ldots+f_1x^2+f_0x+f_-$, where $f_-$ is the extended component (tentative value).

Specifically, error correction section 40 subtracts the corresponding error magnitude $e_u$ from the symbol at the error location $j_u$ of the input data XDI. Since this is an operation in the extension field of the Galois field GF(2), addition of the error magnitude $e_u$ to the symbol is allowed in place of the subtraction. As for the extended component, the error correction section 40 substitutes $x=\alpha^6$ in the polynomial $F_0(x)$ of the error corrected data including only the unextended component, and further adds the extended component $f_-$ (tentative value) of the extended component in the error corrected data to the substitution result. That is, the error correction section 40 performs the following computation.

$$F_0(\alpha^6)+f_-=f_{126}(\alpha^6)^{126}+f_{125}(\alpha^6)^{125}+\ldots+f_1\alpha^6+f_0+f_-.$$

When $F_0(\alpha^6)+f_-$ is zero, it is determined that the extended component $f_-$ (tentative value) of the error corrected data has no error. Therefore, the error correction section 40 sets the extended component $f_-$ (tentative value) of the error corrected data as the error corrected data on the extended component as it is, and determines that the number of errors of the extended component NB=0. When $F_0(\alpha^6)+f_-$ is not zero, the error correction section 40 determines that the extended component $f_-$ (tentative value) of the error corrected data has an error and computes the error magnitude $e_-$ of the extended component $f_-$ of the error corrected data as $F_0(\alpha^6)+f_-$. Thereafter, the error correction section 40 performs error correction for the extended component $f_-$ (tentative value) of the error corrected data, i.e., adds the error magnitude $e_-=F_0(\alpha^6)+f_-$ to the extended component $f_-$ (tentative value) of the error corrected data as follows.

$$f_-+e_-=f_-+F_0(\alpha^6)+f_-=F_0(\alpha^6)+2f_-=F_0(\alpha^6).$$

The error correction section 40 sets $F_0(\alpha^6)$ as the error corrected data including the extended component and sets the number of errors in the extended component NB at one (NB=1). Further, the error correction section 40 determines whether the number of errors EN1 estimated by the error number estimation section 60 is equal to the number of errors EN2 computed by the error number computation section 70 and whether the number of errors EN1 estimated by the error number estimation section 60 and the number of errors EN2 computed by the error number computation section 70 are both equal to or less than three (the number of corrections t), i.e., whether EN1 and EN2 satisfy a relationship of "EN1=EN2≦3". When "EN1=EN2≦3" is satisfied, the error correction section 40 asserts a third flag signal F3 to be described later. In addition, when "EN1=EN2≦3" (the third flag signal F3 is active) and one of the input data syndromes SI is not zero (the first flag signal F1 is inactive and error correction is necessary), the error correction section 40 outputs the error corrected data to the syndrome computation section 10 and the data storage section 50 as the first corrected data C1. When not, i.e., "EN1≠EN2, EN1>3 or EN2<3" (the third flag signal F3 is inactive) or all the input data syndromes SI are zero (the first flag signal F1 is active and error correction is unnecessary), the error correction section 40 outputs the input data XDI output from the data storage section 50 to the syndrome computation section 10 and the data storage section 50 as the first corrected data C1.

The data storage section 50 stores the first corrected data C1, and returns the same corrected data XC1 as the first corrected data C1 to the error correction section 40.

The syndrome computation section 10 computes syndromes of the first corrected data C1=($d_{126}, d_{125}, \ldots, d_1, d_0, d_-$) as corrected data syndromes SC, using the following polynomials:

Polynomial of the first corrected data C1 including only the unextended component $D_0(x)=d_{126}x^{126}+d_{125}x^{125}+\ldots+d_1x+d_0$; and Polynomial of the first corrected data C1 $D(x)=d_{126}x^{127}+d_{125}x^{126}+\ldots+d_1x^2+d_0x+d_-$. Specifically, the syndrome computation section 10 computes the corrected data syndromes of the unextended component are computed as follows.

$$SC_i=D_0(\alpha^i)=d_{126}(\alpha^i)^{126}+d_{125}(\alpha^i)^{125}+\ldots+d_1\alpha^i+d_0,$$
where $i=1,2,3,4$ and 5.

Further, the syndrome computation section 10 computes the corrected data syndromes of the extended component as follows.

$$SC_6=D_0(\alpha^6)+d_-=d_{126}(\alpha^6)^{126}+d_{125}(\alpha^6)^{125}+\ldots+d_1\alpha^6+d_0+d_{31}$$

In addition, the syndrome computation section 10 determines whether the determination condition of "ARE ALL CORRECTED DATA SYNDROMES ZERO OR 'EN1≠EN2, EN1>3, OR EN2>3' (THIRD FLAG SIGNAL IS INACTIVE)?" is true. When the determination condition is true, the syndrome computation section 10 determines that the first corrected data C1 has no error, asserts a second flag signal F2, and outputs the second flag signal F2 to the error correction section 40. When not, i.e., one of the corrected data syndromes SC is not zero and 'EN1=EN2≦3' (the third flag signal F3 is active), the syndrome computation section 10 determines that the first corrected data C1 has an error, negates the second flag signal F2, and outputs the second flag signal F2 to the error correction section 40.

When the second flag signal F2 is active, it is considered that the first corrected data C1 has no error. Therefore, the error correction section 40 outputs the first corrected data XC1 output from the data storage section 50 as second corrected data C2 as it is. When the second flag signal F2 is inactive, it is considered that the first corrected data C1 has an error. Therefore, the error correction section 40 restores the first corrected data XC1 output from the data storage section 50 to the input data DI based on the error locations $j_u$ corresponding to the respective roots $\alpha^{-ju}$ of the error locator polynomial $\sigma(z)$ output from the Chien search section 30, error magnitudes $e_u$ output from the evaluator/locator polynomial deriving section 20, and the error magnitude $e_-$ of the extended component. Specifically, the error correction section 40 adds or subtracts the corresponding error magnitude $e_u$ to or from the symbol at the error location $J_u$ of the first corrected data XC1, and further adds or subtracts the error magnitude $e_-$ to or from the symbol of the extended component of the first corrected data XC1 (that is, adds or subtracts the error magnitude $e_u$ and error magnitude $e_-$ to or from the symbol of the extended component of the first corrected data XC1). The error correction section 40 outputs the restored input data DI thus obtained as the second corrected data C2.

Figure 5:
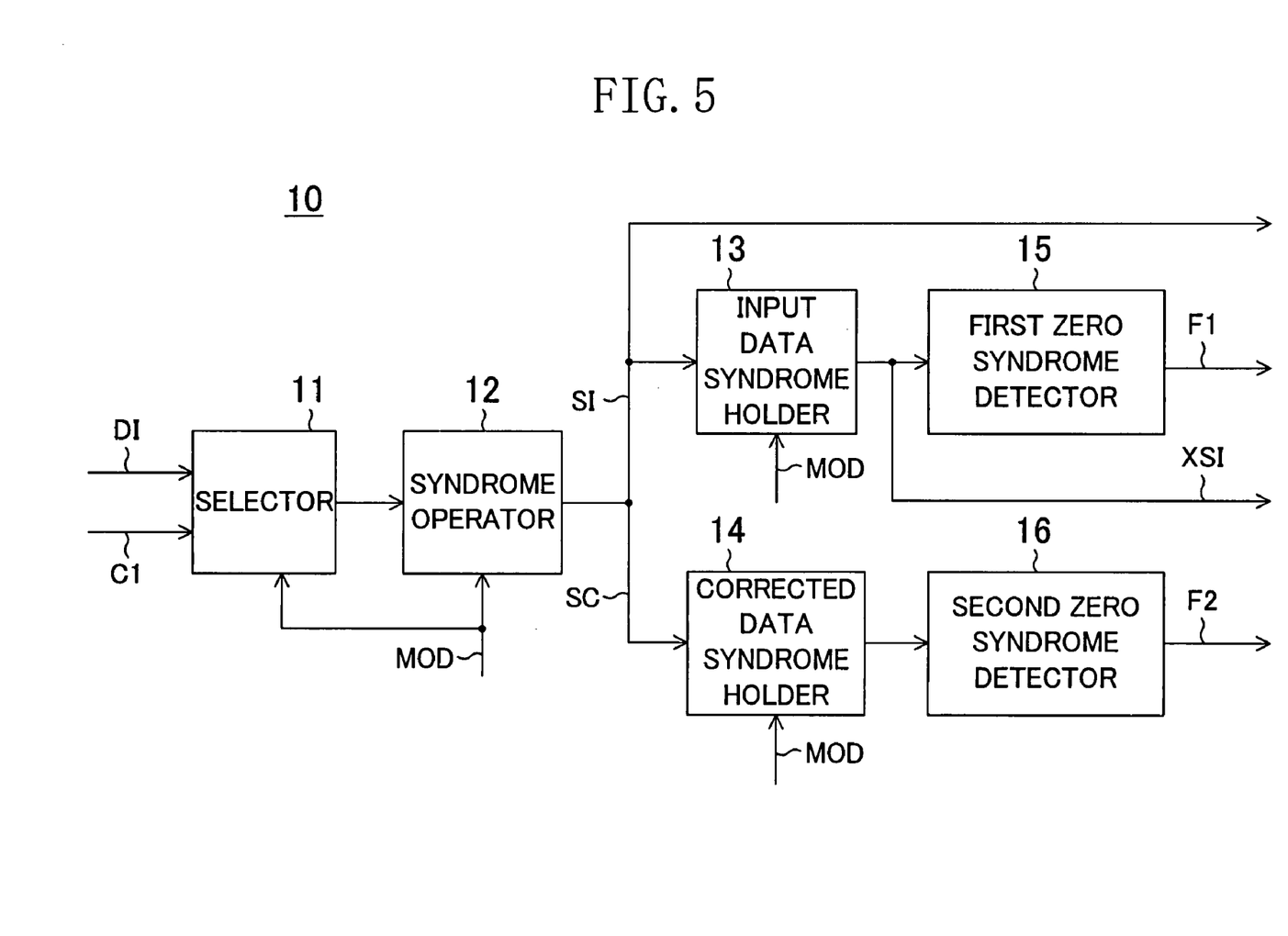
FIG. 5 is a block diagram illustrating important constituent elements of a syndrome computation section shown in FIG. 4.

FIG. 5 is a block diagram illustrating important constituent elements of the syndrome computation section 10 shown in FIG. 4. In FIG. 5, reference symbol 11 denotes a selector, 12 denotes a syndrome operator, 13 denotes an input data syndrome holder, 14 denotes a corrected data syndrome holder, 15 denotes a first zero syndrome detector, and 16 denotes a second zero syndrome detector.

The selector 11 selects the input data DI or the first corrected data C1 in accordance with a mode signal MOD, and outputs the selected data to the syndrome operator 12.

The syndrome operator 12, which operates in synchronization with the selector 11 in accordance with the mode signal MOD, performs computation for obtaining the input data syndromes SI and that for obtaining the corrected data syndromes SC, outputs the result of computation for obtaining the input data syndromes SI to the input data syndrome holder 13 and the error number estimation section 60, and outputs the result of computation for obtaining the corrected data syndromes SC to the corrected data syndrome holder 14. In order to make a circuit scale small, it is preferable to constitute the syndrome holder 12 so that an unextended component syndrome processing and an extended component syndrome processing are performed by the same processor.

The input data syndrome holder 13 fetches and holds only the input data syndromes SI among the outputs of the syndrome operator 12 in accordance with the mode signal MOD, and then outputs the input data syndromes SI to the first zero syndrome detector 15 as input data syndromes XSI.

When all the input data syndromes XSI are zero, the first zero syndrome detector 15 determines that the input data DI has no error, and asserts the first flag signal F1. When one of the input data syndromes XSI is not zero, the first zero syndrome detector 15 determines that the input data DI has an error, negates the first flag signal F1, and outputs the first flag signal F1 to the error correction section 40.

Further, the input data syndrome holder 13 outputs the input data syndromes XSI to the evaluator/locator polynomial deriving section 20 synchronously with a timing at which the first zero syndrome detector 15 outputs the first flag signal F1.

Likewise, the corrected data syndrome holder 14 fetches and holds only the corrected data syndromes SC among the outputs of the syndrome operator 12 in accordance with the mode signal MOD, and then outputs the corrected data syndromes SC to the second zero syndrome detector 16.

When all the corrected data syndromes SC are zero, the second zero syndrome detector 16 determines that the first corrected data C1 has no error, and asserts the second flag signal F2. When one of the corrected data syndromes SC is not zero, the second zero syndrome detector 16 determines that the first corrected data C1 has an error, negates the second flag signal F2, and outputs the second flag signal F2 to the error correction section 40.

Figure 6:
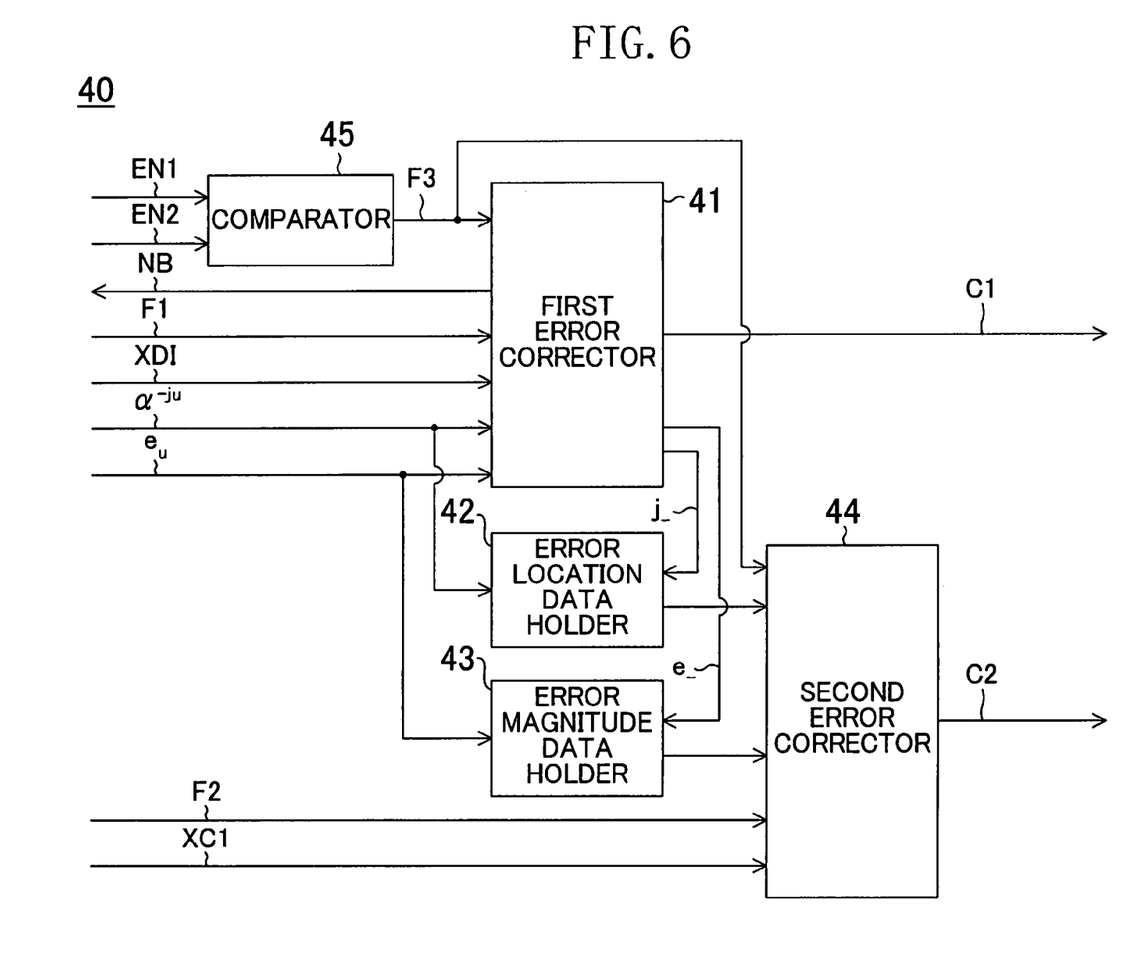
FIG. 6 is a block diagram illustrating important constituent elements of an error correction section shown in FIG. 4.

FIG. 6 is a block diagram illustrating important constituent elements of the error correction section 40 shown in FIG. 4. In FIG. 6, reference symbol 41 denotes a first error corrector, 42 denotes an error location data holder, 43 denotes an error magnitude data holder, 44 denotes a second error corrector, and 45 denotes a comparator.

The comparator 45 compares the number of errors EN1 estimated by the error number estimation section 60 with the number of errors EN2 computed by the error number computation section 70, and further compares these numbers of errors EN1 and EN2 with three (the number of error corrections t). When "EN1=EN2≦3", the comparator 45 asserts the third flag signal F3. When not ("EN1≠EN2, EN1>3 or EN2>3"), the comparator 45 negates the third flag signal F3, and outputs the third flag signal F3 to the first error corrector 41 and the second error corrector 44.

When the first flag signal F1 is active (it is unnecessary to perform error correction for the input data DI) or the third flag signal F3 is inactive ("EN1≠EN2, EN1>3 or EN2>3"), the first error corrector 41 outputs the input data DI as the first corrected data C1 as it is and sets the number of errors in the extended component NB at zero (NB=0). When the first flag signal F1 is inactive (the input data DI has an error and it is necessary to correct the error) and the third flag signal F3 is active ("EN1=EN2≦3"), the first error corrector 41 performs error correction for the input data XDI, i.e., subtracts or adds the error magnitudes $e_u$ corresponding to the respective error locations $j_u$, which correspond to the roots $\alpha^{-ju}$, to or from the symbols of the input data XDI indicated by the error locations $j_u$. The first error corrector 41 outputs the corrected data as error corrected data. For the extended component, the first error corrector 41 substitutes $x=\alpha^6$ in the polynomial $F_0(x)$ of the error corrected data including only the unextended component, and further adds the extended component $f_-$ (tentative value) of the error corrected data to the substitution result. That is, the first error corrector 41 performs the following computation.

$$F_0(\alpha^6)+f_-=f_{126}(\alpha^6)^{126}+f_{125}(\alpha^6)^{125}+\ldots+f_1\alpha^6+f_0+f_-.$$

When $F_0(\alpha^6)+f_-$ is zero, it is considered that the extended component $f_-$ (tentative value) of the error corrected data has no error. Therefore, the first error corrector 41 sets the extended component $f_-$ (tentative value) of the error corrected data as the error corrected data on the extended component as it is and sets that the number of errors in the extended component NB at zero (NB=0). When $F_0(\alpha^6)+f_-$ is not zero, the first error corrector 41 determines that the extended component $f_-$ (tentative value) of the error corrected data has an error, and computes the error magnitude $e_-$ of the extended component $f_-$ (tentative value) of the error corrected data as $F_0(\alpha^6)+f_-$. Thereafter, the first error corrector 41 performs error correction for the extended component f_ (tentative value) of the error corrected data, i.e., adds the error magnitude $e=F_0(\alpha^6)+f\_$ to the extended component f_ (tentative value) of the error corrected data as follows.

$$f\_+e\_=f\_+F_0(\alpha^6)+f\_=F_0(\alpha^6)+2f\_=F_0(\alpha^6).$$

The first error corrector 41 sets the addition result as the error corrected data including the extended component and sets the number of errors in the extended component NB at one (NB=1). The first error corrector 41 outputs the error corrected data as the first corrected data C1. The first error corrected data C1 thus obtained is output to the syndrome computation section 10 and the data storage section 50.

The error location data holder 42 stores the roots $\alpha^{-ju}$ and the error locations j_ for the extended component, and outputs the stored roots $\alpha$ and locations to the second error corrector 44.

The error magnitude data holder 43 stores the error magnitude $e_u$ and the error magnitude e_ for the extended component, and outputs the stored magnitudes to the second error corrector 44.

The second error corrector 44 outputs the first corrected data XC1 as the second corrected data C2 as it is when the second flag signal F2 is active (it is unnecessary to perform error correction for the first corrected data C1) or the third flag signal F3 is inactive ("EN1≠EN2, EN1>3 or EN2>3"). When the second flag signal F2 is inactive (the first corrected data C1 has an error and it is necessary to correct the error) and the third flag signal F3 is active ("EN1=EN2≦3"), second error corrector 44 restores the first corrected data XC1 to the input data DI based on the error locations $j_u$ and the error magnitudes $e_u$ corresponding to the roots $\alpha^{-ju}$ and, also, based on the error location j_ and the error magnitude e_ for the extended component. This restoration can be performed by adding or subtracting the error magnitudes $e_u$ corresponding to the error location $j_u$ to or from the symbols of the first corrected data XC1 indicated by the error locations $j_u$. As for the extended component, the restoration can be performed by further adding or subtracting the error magnitude $e_u$ corresponding to the error location j (extended component) to or from the symbol (extended component) of the first corrected data XC1 indicated by the error location j_ (that is, by adding or subtracting the error magnitudes $e_u$ and e_ to or from the symbol of the extended component of the first corrected data XC1). The second error corrector 44 outputs the restored input data DI as the second corrected data C2. As described above, when the first error corrector 41 fails to perform the error correction and the first corrected error C1 has an error, the second error corrector 44 outputs not the first corrected data C1 but the restored input data DI.

Figure 7:
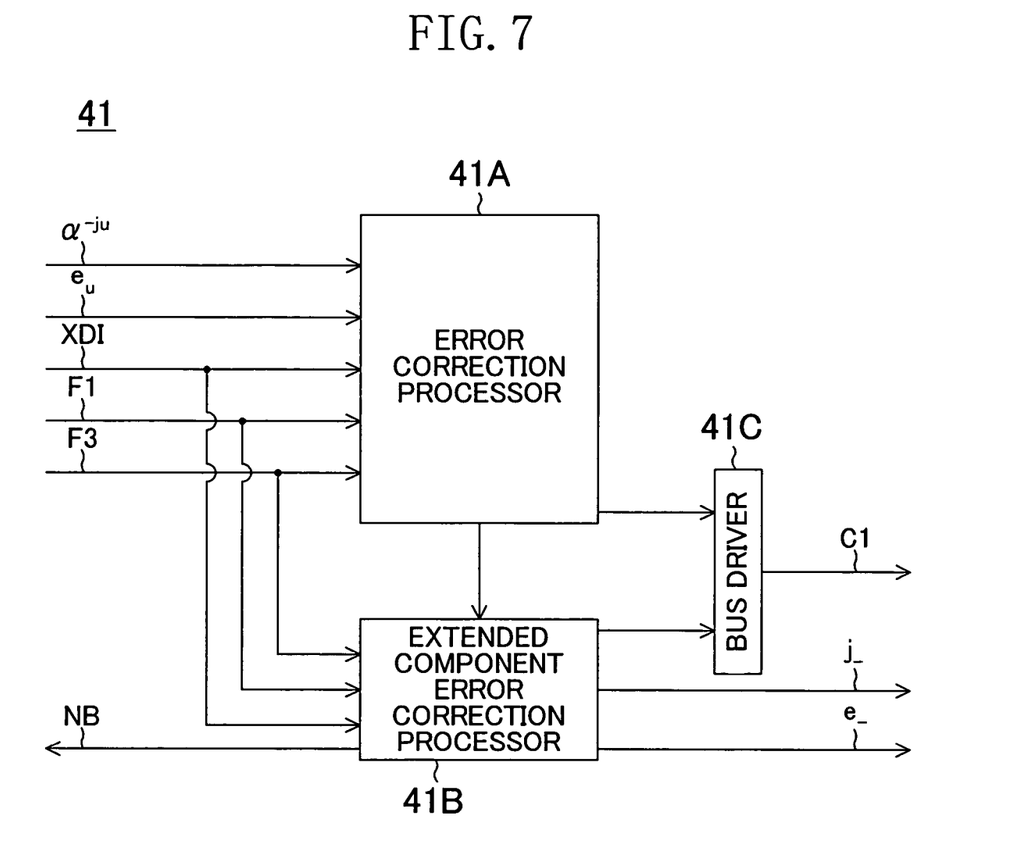
FIG. 7 is a block diagram illustrating important constituent elements of a first error correction section shown in FIG. 6.

FIG. 7 is a block diagram illustrating important constituent elements of the first error correction section 41 shown in FIG. 6. In FIG. 7, reference symbol 41A denotes an error correction processor, 41B denotes an extended component error correction processor, and 41C denotes a bus driver.

The error correction processor 41A outputs the input data XDI as the first corrected data as it is when the first flag signal F1 is active (it is unnecessary to perform error correction for the input data DI) or the third flag signal F3 is inactive ("EN1≠EN2, EN1>3 or EN2>3"). When the first flag signal F1 is inactive (the input data DI has an error and it is necessary to correct the error) and the third flag signal F3 is active ("EN1=EN2≦3"), the error correction processor 41A performs error correction by subtracting or adding the error magnitudes $e_u$ for the error locations $j_u$ from or to the symbols indicated by the error locations $j_u$ corresponding to the roots $\alpha^{-ju}$ in the input data XDI, and outputs the corrected data as the first corrected data.

The extended component error correction processor 41B outputs the extended component of the error corrected data (tentative value) (extended component input data XDI) of the error corrected data as the first corrected data on the extended component as it is, and sets the number of errors in the extended component NB at zero (NB=0) when the first flag signal F1 is active (it is unnecessary to perform error correction for the input data DI) or the third flag signal F3 is inactive ("EN1≠EN2, EN1>3 or EN2>3"). When the first flag signal F1 is inactive (the input data DI has an error and it is necessary to correct the error) and the third flag signal F3 is active ("EN1=EN2≦3"), the extended component error correction processor 41B further adds the extended component f_ (tentative value) of the error corrected data to the polynomial $F_0(x)$ of the error corrected data including only the unextended component, in which $x=\alpha^6$ is substituted. Specifically, the extended component error correction processor 41B performs the following computation for the extended data.

$$F_0(\alpha^6)+f\_=f_{126}(\alpha^6)^{126}+f_{125}(\alpha^6)^{125}+\ldots+f_1\alpha^6+f_0+f\_.$$

When $F_0(\alpha^6)+f\_$ is zero, it is considered that the extended component f_ (tentative value) of the error corrected data has no error. Therefore, the extended component error correction processor 41B sets the extended component f_ (tentative value) of the error corrected data as the error corrected data on the extended component as it is, and determines that the number of errors in the extended component NB is zero (NB=0). When $F_0(\alpha^6)+f\_$ is not zero, the extended component error correction processor 41B determines that the extended component f_ (tentative value) of the error corrected data has an error, and computes the error magnitude e_ of the extended component f_ (tentative value) of the error corrected data as $F_0(\alpha^6)+f\_$. Thereafter, the extended component error correction processor 41B performs error correction for the extended component f_ (tentative value) of the error corrected data, i.e., adds the error magnitude $e=F_0(\alpha^6)+f\_$ to the extended component f_ (tentative value) of the error corrected data as follows.

$$f\_+e\_=f\_+F_0(\alpha^6)+f\_=F_0(\alpha^6)+2f\_=F_0(\alpha^6).$$

The extended component error correction processor 41B sets the addition result as the error corrected data including the extended component and sets the number of errors in the extended component NB at one (NB=1). The extended component error correction processor 41B outputs the error corrected data on the extended component as the first corrected data on the extended component.

The bus driver 41C batch-outputs the first corrected data from the error correction processor 41A and the first corrected data on the extended component from the extended component error correction processor 41B as first corrected data C1 made of the unextended component and the extended component.

As described above, in the decoding device shown in FIGS. 4 to 7, the error correction section 40 compares the number of errors EN1 estimated from the input data syndromes SI by the error number estimation section 60 with the number of errors EN2 computed by the error number computation section 70 in the decoding process. After the error correction section 40 performs the error correction based on this comparison result and the input data syndromes SI, the syndrome computation section 10 performs syndrome computation again for the error corrected data C1 to obtain the corrected data syndromes SC. When the input data DI is erroneously corrected or the estimated number of errors EN1 differs from the computed number of errors EN2, the input data DI is output as the second corrected data C2.

The function of the error number estimation section 60 shown in FIG. 4 and that of the error number calculation section 70 may be moved into the syndrome computation section 10 and the error correction section 40, respectively.

In FIG. 4, the error number computation section 70 obtains the number of errors NA from the roots $\alpha^{-ju}$. Alternatively, the Chien search section 30 may obtain the number of errors NA.

Further, the processings performed by the two processors 41A and 41B shown in FIG. 7 may be performed by the same processor.

Figure 8:
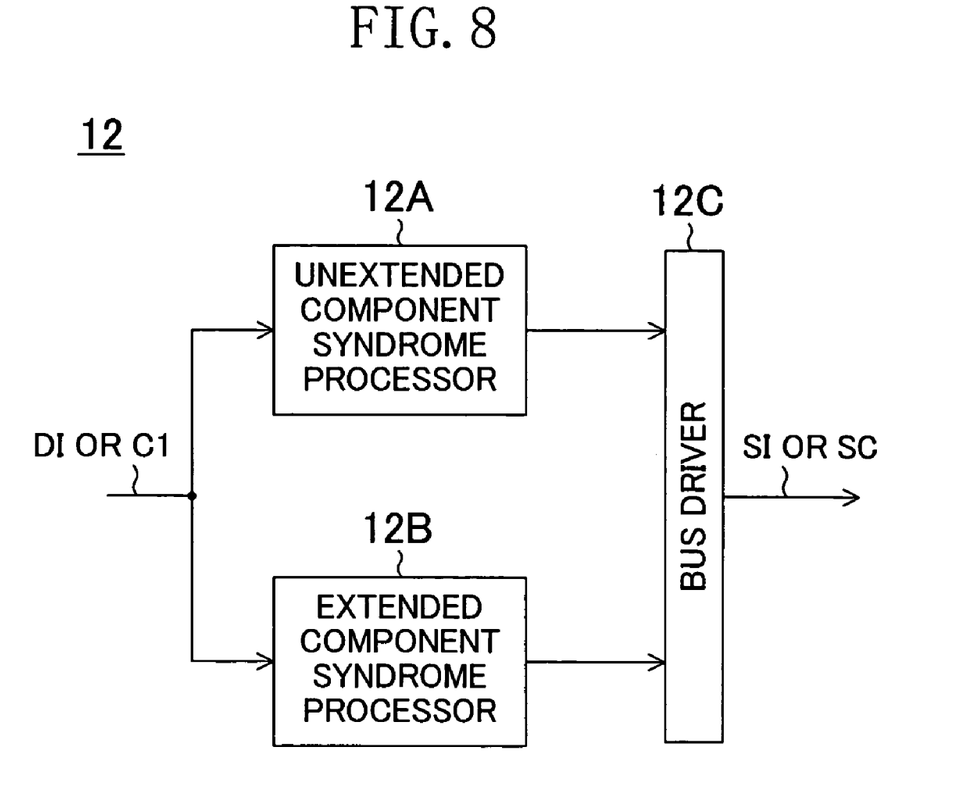
FIG. 8 is a block diagram illustrating one example of the configuration of a syndrome operator shown in FIG. 5.

The syndrome operator 12 shown in FIG. 5 may be constituted so that different processors perform the extended component processing and the extended component processing, respectively. FIG. 8 is a block diagram illustrating important constituent elements of the syndrome operator 12 constituted as described above. In FIG. 8, reference symbol 12A denotes an unextended component syndrome processor, 12B denotes an extended component syndrome processor, and 12C denotes a bus driver.

The unextended component syndrome processor 12A computes syndromes of the unextended component of the input data DI and those of the unextended component of the first corrected data C1, and outputs the computed syndromes to the bus driver 12C.

The extended component syndrome processor 12B computes syndromes of the extended component of the input data DI and those of the extended component of the first corrected data C1, and outputs the computed syndromes to the bus driver 12C.

The bus driver 12C batch-outputs the syndromes of the input data unextended component from the unextended component syndrome processor 12A and the syndromes of the input data extended component from the extended component syndrome processor 12B as the input data syndromes SI. The bus driver 12C batch-outputs the syndromes of the corrected data unextended component from the unextended component syndrome processor 12A and syndromes of the corrected data extended component from the extended component syndrome processor 12B as the corrected data syndromes SC.

It is preferable to adopt a pipeline architecture in which the processings such as the computation of the input data syndromes SI by the syndrome computation section 10 are performed at a first stage, the processings by the evaluator/locator polynomial deriving section 20 and the Chien search section 30 are performed at a second stage, the processings such as the output of the first corrected data C1 by the error correction section 40 and the computation of the corrected data syndromes SC by the syndrome computation section 10 are performed at a third stage, and the output processing of the second corrected data C2 by the error correction section 40 is performed at a fourth stage. The syndrome computation section 10 operates with a frequency twice as high as a reference clock signal and is used twice (at the first and third stages) in a series of decoding processes.

As described above, the decoding method and the decoding device according to the present invention can prevent erroneous correction during decoding and can be effectively used for multiple error correction for the Reed-Solomon code or the extended Reed-Solomon code in digital broadcasting, digital magnetic recording and the like.

What is claimed is:

1. A method for decoding a received word made of one of a Reed-Solomon code and an extended Reed-Solomon code having a certain number of error corrections as input data, the decoding method comprising:
 a first error correction step of perform in error correction for the input data using an error locator polynomial and an error evaluator polynomial derived based on the input data and syndromes of the number of error corrections, and setting the result of error correction as first corrected data;
 a syndrome computation step of computing syndromes of the first corrected data;
 a second error correction step of performing error correction for the first corrected data based on the syndromes computed in the syndrome computation step, and setting the result of error correction as second corrected data;
 an error number estimation step of estimating the number of errors generated in the input data based on the syndromes of the input data; and
 an error number computation step of computing the number of errors using the error locator polynomial and the error evaluator polynomial derived based on the syndromes of the input data and the number of error corrections, wherein
 in the first error correction step, the error correction is performed for the input data using the number of errors estimated in the error number estimation step and the number of errors computed in the error number computation step.

2. The decoding method of claim 1, wherein
the first error correction step comprises:
 an error number determination step of determining whether a first determination condition that the estimated number of errors is equal to the computed number of errors and that both the estimated number of errors and the computed number of errors are equal to or smaller than the number of error corrections is true;
 an error correction step of performing the error correction for the input data to obtain error corrected data, and obtaining error corrected data on an extended component based on the error corrected data;
 a step of setting the error corrected data obtained in the error correction step as the first corrected data when it is determined in the error number determination step that the first determination condition is true and it is determined that one of the syndromes of the input data is not zero; and
 a step of setting the input data as the first corrected data when it is determined in the error number determination step that the first determination condition is false and it is determined that all the syndromes of the input data are zero.

3. The decoding method of claim 1, wherein
in the second error correction step, the error correction is performed for the first corrected data based on the syndromes of the first corrected data, the estimated number of errors, and the computed number of errors.

4. The decoding method of claim 2, further comprising
a step of determining whether a second determination condition that all the syndromes of the first corrected data are zero or that it is determined in the error number determination step that the first determination condition is false is true, wherein
in the second error correction step, when the second determination condition is true, the first corrected data is set as the second corrected data, and when the second determination condition is false, the input data is restored and set as the second corrected data.

5. The decoding method of claim 1, wherein the error number estimation step comprises:
a first step of determining whether all the syndromes of the input data are zero;
a second step of estimating that the input data has no error when all the syndromes of the input data syndromes are zero;
a third stepof computing first, second, third and fourth error number estimation equations so as to estimate the number of errors in an unextended component in the input data when one of the syndromes of the input data is not zero;
a fourth step of determining whether all values of the first, second and third error number estimation equations are zero;
a fifth step of determining whether an extended component of the syndromes of the input data is zero when it is determined in the fourth step that all the values of the first, second and third error number estimation equations are zero;
a sixth step of estimating that the number of errors is equal to a value obtained by subtracting two from the number of error corrections when it is determined in the fifth step that the extended component of the syndromes of the input data is zero;
a seventh step of estimating that the number of errors is equal to a value obtained by subtracting one from the number of error corrections when it is determined in the fifth step that the extended component of the syndromes of the input data is not zero;
an eighth step of determining that a value of the fourth error number estimation equation is zero when it is determined in the fourth step that one of the values of the first, second and third error number estimation equations is not zero;
a ninth step of determining whether the extended component of the syndromes of the input data is zero when it is determined in the eighth step that the value of the fourth error number estimation equation is zero;
a tenth step of estimating that the number of errors is equal to the value obtained by subtracting one from the number of error corrections when it is determined in the ninth step that the extended component of the syndromes of the input data is zero;
an eleventh step of estimating that the number of errors is equal to the number of error corrections when it is determined in the ninth step that the extended component of the syndromes of the input data is not zero;
a twelfth step of determining whether the extended component of the syndromes of the input data is zero when it is determined in the eighth step that the value of the fourth error number estimation equation is not zero;
a thirteenth step of estimating that the number of errors is equal to the number of error corrections when it is determined in the twelfth step that the extended component of the syndromes of the input data is zero; and
a fourteenth step of estimating that the number of errors is equal to a value obtained by adding one to the number of error corrections when it is determined in the twelfth step that the extended component of the syndromes of the input data is not zero.

6. The decoding method of any of claims 1 to 5 wherein the number of error corrections is three.

7. A device for decoding a received word made of one of a Reed-Solomon code and an extended Reed-Solomon code having a certain number of error corrections as input data, the decoding device comprising:
a syndrome computation section for obtaining syndromes of the input data as input data syndromes, outputting a first flag signal that indicates whether the input data has an error based on the input data syndromes, obtaining syndromes of first corrected data obtained based on the input data and the input data syndromes as corrected data syndromes, and outputting a second flag signal that indicates whether the first corrected data has an error based on the corrected data syndromes;
an error number estimation section for estimating the number of errors generated in the input data based on the input data syndromes computed by the syndrome computation section;
an evaluator/locator polynomial deriving section for obtaining coefficients at each order of an error evaluator polynomial and an error locator polynomial based on the input data syndromes, and obtaining error magnitudes based on error evaluation values and corresponding error locator polynomial differential values both obtained from the coefficients;
a Chien search section for obtaining roots of the error locator polynomial based on the coefficients, and computing the error evaluation values by substituting the roots in the error evaluator polynomial and the error locator polynomial differential values by substituting the roots in a derivative of the error locator polynomial;
an error number computation section for computing the number of errors based on the input data, the roots and the error magnitudes; and
an error correction section for performing error correction for the input data to obtain error corrected data based on the input data, the roots and the corresponding error magnitudes, wherein
the error correction section outputs the error corrected data as the first corrected data when the number of errors estimated by the error number estimation section is equal to the number of errors computed by the error number computation section, both the number of errors estimated by the error number estimation section and the number of errors computed by the error number computation section are equal to or less than the number of error corrections, and the first flag signal indicates that the input data has an error,
the error correction section outputs the input data as the first corrected data when the number of errors estimated by the error number estimation section is not equal to the number of errors computed by the error number computation section, one of the number of errors estimated by the error number estimation section and the number of errors computed by the error number computation section is greater than the number of error corrections, or the first flag signal indicates that the input data has no error,
the error correction section outputs data, obtained by performing restoration for the first corrected data for restoring the first corrected data to the input data, as the second corrected data when the second flag signal indicates that the first corrected data has an error, the number of errors estimated by the error number estimation section is equal to the number of errors computed by the error number computation section, and both the number of errors estimated by the error number estimation section and the number of errors computed by the error number computation section are equal to or less than the number of error corrections, and the error correction section outputs the first corrected data as the second corrected data when the second flag signal indicates that the first corrected data has no error, the number of errors estimated by the error number estimation section is not equal to the number of errors computed by the error number computation section, or one of the number of errors estimated by the error number estimation section and the number of errors computed by the error number computation section is greater than the number of error correction.

8. The decoding device of claim 7, wherein the syndrome computation section comprises:

a selector for receiving the input data and the first corrected data that is output from the error correction section, and sequentially selecting and outputting the received input data and the received first corrected data;

a syndrome operator for obtaining the input data syndromes based on the input data output from the selector, and the corrected data syndromes based on the first corrected data;

an input data syndrome holder for holding and outputting the input data syndromes;

a corrected data syndrome holder for holding and outputting the corrected data syndromes;

a first zero syndrome detector for outputting the first flag signal so as to indicate that the input data has no error when all the input data syndromes output from the input data syndrome holder are zero, and outputting the first flag signal so as to indicate that the input data has an error when one of the input data syndromes output from the input data syndrome holder is not zero; and a second zero syndrome detector for outputting the second flag signal so as to indicate that the first corrected data has no error when all the corrected data syndromes output from the corrected data syndrome holder are zero, and outputting the second flag signal so as to indicate that the first corrected data has an error when one of the corrected data syndromes output from the corrected data syndrome holder is not zero.

9. The decoding device of claim 8, wherein the syndrome operator comprises:

an unextended component syndrome processor for obtaining the input data syndromes and the corrected data syndromes of an unextended component based on the input data and the first corrected data sequentially output from the selector;

an extended component syndrome processor for obtaining the input data syndromes and the corrected data syndromes of an extended component based on the input data and the first corrected data sequentially output from selector; and a bus driver for batch-outputting the input data syndromes of the unextended component output from the unextended component syndrome processor and the input data syndromes of the extended component output from the extended component syndrome processor, and batch-outputting the corrected data syndromes of the unextended component output from the unextended component syndrome processor and the corrected data syndromes of the extended component output from the extended component syndrome processor.

10. The decoding device of claim 7, wherein the error correction section comprises:

a comparison section for comparing the number of errors estimated by the error number estimation section with the number of errors computed by the error number computation section;

a first error corrector for outputting the first corrected data, an error location, an error magnitude and the number of errors;

an error location data holder for holding and outputting the error location;

an error magnitude data holder for holding and outputting the error magnitude; and a second error corrector for outputting the second corrected data, wherein the comparison section outputs a third flag signal that indicates whether the number of errors estimated by the error number estimation section is equal to the number of errors computed by the error number computation section and whether both the number of errors estimated by the error number estimation section and the number of errors computed by the error number computation section are equal to or less than the number of error corrections, the first error corrector performs error correction for the input data by subtracting or adding corresponding the error magnitude from or to a symbol indicated by the error location corresponding to the respective roots to obtain error corrected data, and obtains error corrected data on an extended component based on the error corrected data to set the obtained pieces of error corrected data as error corrected data, the first error corrector outputs the error corrected data as the first corrected data when the third flag signal indicates that the number of errors estimated by the error number estimation section is equal to the number of errors computed by the error number computation section and that both the number of errors estimated by the error number estimation section and the number of errors computed by the error number computation section are equal to or less than the number of error corrections, and the first flag signal indicates that the input data has an error, the first error corrector outputs the input data as the first corrected data when the third flag signal indicates that the number of errors estimated by the error number estimation section is not equal to the number of errors computed by the error number computation section or that one of the number of errors estimated by the error number estimation section and the number of errors computed by the error number computation section is greater than the number of error corrections, or the first flag signal indicates that the input data has no error, the second error corrector performs restoration for the first corrected data for restoring the first corrected data to the input data by adding or subtracting the error magnitude corresponding to the symbol indicated by the error location to or from the first corrected data and outputting the obtained data as the second corrected data when the second flag signal indicates that the first corrected data has an error, and the third flag signal indicates that the number of errors estimated by the error number estimation section is equal to the number of errors computed by the error number computation section and that both the number of errors estimated by the error number estimation section and the number of errors computed by the error number computation section are equal to or less than the number of error corrections, and the second error corrector outputs the first corrected data as the second corrected data when the second flag signal indicates that the first corrected data has no error, or the third flag signal indicates that the number of errors estimated by the error number estimation section is not equal to the number of errors computed by the error number computation section or that one of the number of errors estimated by the error number estimation section and the number of errors computed by the error number computation section is greater than the number of error corrections.

11. The decoding device of claim 10, wherein the first error corrector comprises:

an error correction processor for outputting the first corrected data;

an extended component error correction processor for outputting the first corrected data on an extended component as well as the error location, the error magnitude and the number of errors for the extended component; and a bus driver for batch-outputting the first corrected data and the first corrected data on the extended component as the first corrected data, wherein the error correction processor performs error correction for the input data by subtracting or adding corresponding the error magnitude from or to the symbol indicated by the error location corresponding to the respective roots to obtain error corrected data, the error correction processor outputs the error corrected data as the first corrected data when the third flag indicates that the number of errors estimated by the error number estimation section is equal to the number of errors computed by the error number computation section and that both the number of errors estimated by the error number estimation section and the number of errors computed by the error number computation section are equal to or less than the number of error correction, and the first flag signal indicates that the input data has an error, the error correction processor outputs the input data as the first corrected data when the third flag indicates that the number of errors estimated by the error number estimation section is not equal to the number of errors computed by the error number computation section or that one of the number of errors estimated by the error number estimation section and the number of errors computed by the error number computation section is greater than the number of error correction, or the first flag signal indicates that the input data has no error, the extended component error correction processor obtains the error corrected data on the extended component based on the error corrected data, and obtains the number of errors in the extended component, the extended component error correction processor outputs the error corrected data on the extended component as the first corrected data on the extended component when the third flag indicates that the number of errors estimated by the error number estimation section is equal to the number of errors computed by the error number computation section and that both the number of errors estimated by the error number estimation section and the number of errors computed by the error number computation section are equal to or less than the number of error corrections, and the first flag signal indicates that the input data has an error, and the extended component error correction processor outputs the input data on the extended component as the first corrected data on the extended component when the third flag indicates that the number of errors estimated by the error number estimation section is not equal to the number of errors computed by the error number computation section or that one of the number of errors estimated by the error number estimation section and the number of errors computed by the error number computation section is greater than the number of error corrections, or the first flag signal indicates that the input data has no error.

12. The decoding device of claim 7, further comprising:

a data storage section for holding and outputting the input data until the error correction section starts obtaining the first corrected data, and holding and outputting the first corrected data until the error correction section starts obtaining the second corrected data.

13. The decoding device of any of claims 7 to 12, wherein the number of error corrections is three.

* * * * *